United States Patent [19]

Kumar et al.

[11] Patent Number: 5,467,037
[45] Date of Patent: Nov. 14, 1995

[54] RESET GENERATION CIRCUIT TO RESET SELF RESETTING CMOS CIRCUITS

[75] Inventors: Manoj Kumar; George M. Lattimore; Joseph M. Poplawski, Jr., all of Austin, Tex.

[73] Assignee: International Business Machines Corporation, Armonk, N.Y.

[21] Appl. No.: 342,967

[22] Filed: Nov. 21, 1994

[51] Int. Cl.[6] .......................................... H03L 7/00
[52] U.S. Cl. .......................... 327/142; 327/143; 327/198; 326/94; 377/73; 377/78
[58] Field of Search ..................... 327/143, 141, 327/142, 198, 437, 545; 326/94; 377/73, 78

[56] References Cited

U.S. PATENT DOCUMENTS

| 4,164,666 | 8/1979 | Hirasawa | 307/208 |
|---|---|---|---|
| 4,423,338 | 12/1983 | Eardley | 307/273 |
| 4,583,008 | 4/1986 | Grugett | 307/265 |
| 4,806,794 | 2/1989 | Walters, Jr. | 307/451 |
| 4,994,687 | 2/1991 | Fujii et al. | 307/291 |
| 5,015,881 | 5/1991 | Chappell et al. | 307/449 |
| 5,061,864 | 10/1991 | Rogers | 307/443 |
| 5,298,799 | 3/1994 | Cochran et al. | 307/273 |
| 5,323,066 | 6/1994 | Feddeler et al. | 307/272.3 |
| 5,323,067 | 6/1994 | Shay | 307/272.3 |
| 5,331,224 | 7/1994 | Ohannes et al. | 307/443 |
| 5,343,085 | 8/1994 | Fujimoro et al. | 307/272.3 |
| 5,371,772 | 12/1994 | Al-Khairi | 377/47 |
| 5,386,152 | 1/1995 | Naraki | 327/143 |

OTHER PUBLICATIONS

T. Chappell et al.; "A 2–ns Cycle, 3.8–ns Access 512–kb CMOS ECL SRAM with a Fully Pipelined Architecture"; IEEE Journal of Solid–State Circuits, vol. 26, No. 11, Nov. 1991, pp. 1577–1585.

Primary Examiner—Timothy P. Callahan
Assistant Examiner—Kenneth B. Wells
Attorney, Agent, or Firm—Whitham, Curtis, Whitham & McGinn; Mark McBurney

[57] ABSTRACT

A self resetting CMOS (SRCMOS) circuit operates with a variable clock cycle. Circuit oscillation is avoided in either long or short clock cycles. At the same time, the circuit eliminates overlapping currents by incorporating a ground interrupt device. The reset generation path is optimized to provide a fast and narrow reset pulse. In addition, the circuit saves power.

12 Claims, 6 Drawing Sheets

5,467,037

RESET GENERATION CIRCUIT TO RESET SELF RESETTING CMOS CIRCUITS

BACKGROUND OF THE INVENTION

1. Field of the Invention

The present invention generally relates to self-resetting complementary metal oxide semiconductor (CMOS) circuits manufactured as integrated circuit (IC) chips and, more specifically, to a reset generating circuit to reset the self-resetting CMOS (SRCMOS) circuits during regular and long clock cycles.

2. Description of the Prior Art

The basic concept of an SRCMOS circuit is to provide a high speed timed data path. In the beginning of a cycle, a RESET signal makes a transition from high to low. This will charge a node of the circuit to the supply voltage. The RESET pulse is approximately 700 picoseconds wide. After a certain time delay, a data signal on an input terminal will go from low to high. This action will discharge the precharged node to ground, causing the output signal at an output terminal to go high. In the beginning of every cycle or, in certain cases, at the end of each cycle, the RESET signal will pulse.

The RESET generation circuit for the SRCMOS circuit creates two problems. First, under certain conditions, the RESET signal will oscillate. Second, a very wide clock pulse width used in the circuit can cause a collision current phenomena.

SUMMARY OF THE INVENTION

It is therefore an object of the present invention to provide a RESET to reset SRCMOS circuits.

It is another object of the invention to generate a RESET signal for SRCMOS circuits without oscillation and collision currents.

According to the invention, there is provided an SRCMOS circuit that works with a variable clock cycle. More specifically, the circuit operates in either a long or short clock cycle. Circuit oscillation is avoided in either long or short clock cycles. At the same time, the circuit eliminates overlapping currents by incorporating a ground interrupt device. The reset generation path is optimized to provide a fast and narrow reset pulse. A reset pulse is selectively generated only in cycles that require it. In addition, the circuit saves power.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
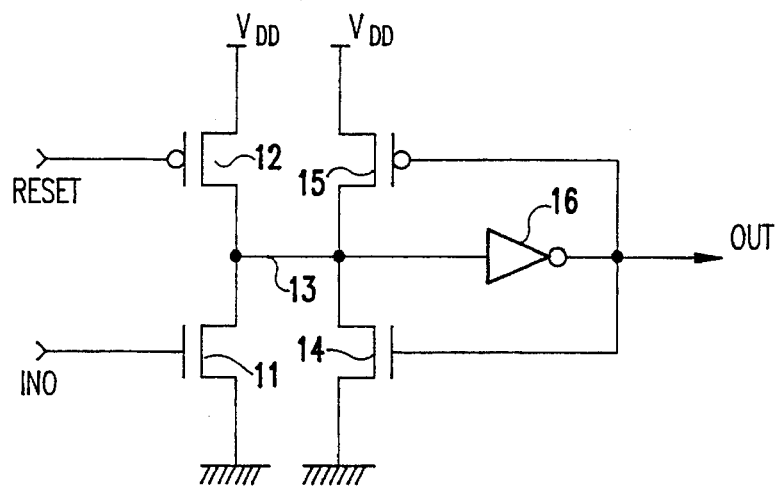
FIG. 1 is a schematic diagram of the prior art SRCMOS circuit.

Referring now to the drawings in detail, and more particularly to FIG. 1, there is shown an example of the basic self reset CMOS (SRCMOS) circuit. The basic SRCMOS circuit, shown in FIG. 1, comprises an n-channel FET 11 and p-channel FET 12. The sources of FETs 12 and 11 are connected to $V_{DD}$ and ground, respectively. The gate of FET 12 is connected to the RESET input terminal, and the gate of FET 11 is connected to a second input terminal IN0. The common node between the drains of FETs 11 and 12 is connected to node 13. Node 13 is also connected to the common drain connection of a second pair of FETs comprising n-channel FET 14 and p-channel FET 15. The source of FET 15 is connected to $V_{DD}$, and the drain of FET 15 is connected to node 13. Similarly, the source of FET 14 is connected to ground, and the drain is connected to node 13. The node 13 is also connected to an invertor 16, the output of which is connected to the OUTPUT terminal. The signal at the output of invertor 16 is also connected to the gates of FETs 14 and 15. The combination of the FETs 14 and 15 and invertor 16 form a latch which, in operation, must first be reset by precharging node 13 to $V_{DD}$.

Figure 2:
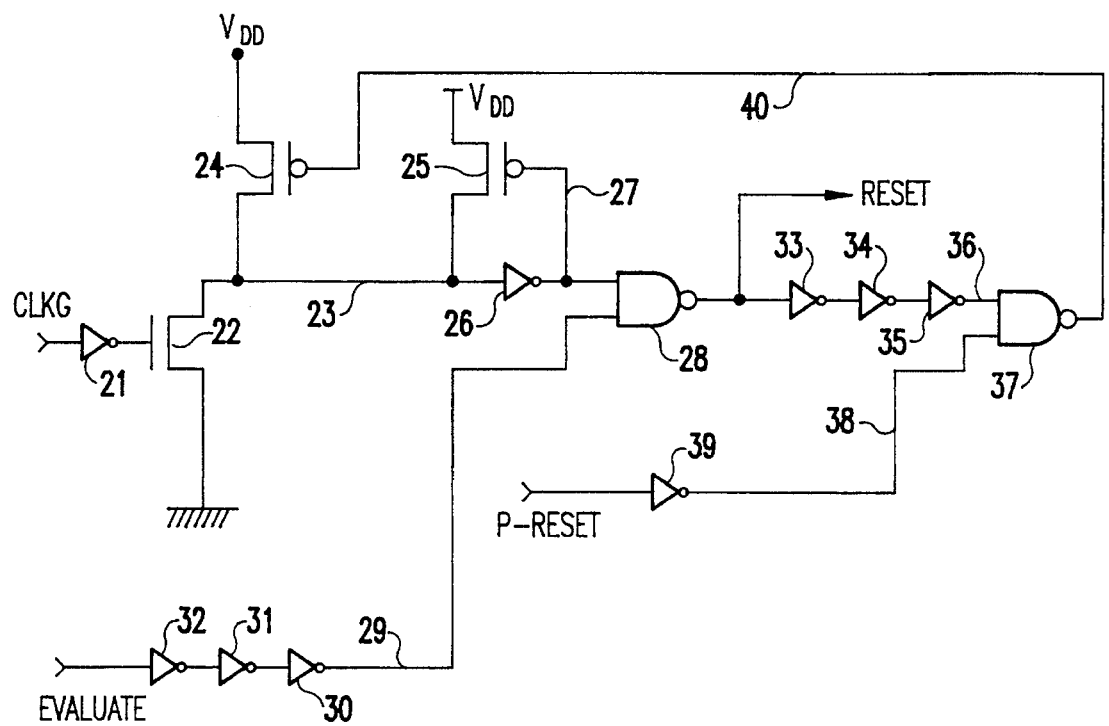
FIG. 2 is a schematic diagram of an example RESET generation circuit for the SRCMOS circuit shown in FIG. 1.

An example of RESET generation is shown in FIG. 2. The input clock signal CLKG is fed to an invertor 21 having its output connected to the gate of n-channel FET 22. The source of FET 22 is connected to ground, and the drain of FET 22 is connected to node 23. Also, the sources of p-channel FETs 24 and 25 are connected to node 23. Node 23 is also the input for the invertor 26. The output of invertor 26 is node 27. Node 27 is fed to one input of NAND gate 28 and also to the gate of FET 25. The other input to NAND gate 28 is node 29, the output of invertor 30 which receives as its input the EVALUATE signal via invertor string 31 and 32. The output of NAND gate 28 is the RESET signal. This RESET signal becomes the input to invertor 33 and p-channel FET 12, shown in FIG. 1. Invertor 33 is part of the invertor string which comprises invertors 34 and 35, the output of which is node 36. Node 36 is one of the inputs to NAND gate 37, and the other input is node 38, the output of invertor 39 which receives as its input a system reset signal, here designated the P_RESET signal. The output of NAND gate 37 is node 40 which is connected to the gate of p-channel FET 24.

In the beginning of each clock cycle, the clock signal CLKG will go from high to low. When CLKG goes low, the output of invertor 21 is forced high and n-channel FET 22 begins to conduct. This action discharges node 23 to ground, causing node 27 to go high due to the action of invertor 26. In the regular mode, the signals EVALUATE and P_RESET are low and therefore nodes 29 and 38 will be high, respectively due to the actions of invertor string 30 to 32 and invertor 39. When node 27 goes high, the RESET signal is pulled low. Also, when the RESET signal goes low, node 36 is forced high due to the action of invertor string 33 to 35, causing node 40 to go low. This will turn p-channel 24 on which will pull node 23 high. After a certain time delay, the RESET signal will go high turning off p-channel FET 12 in FIG. 1. When the RESET signal goes high, it will force node 36 to go low and node 40 to go high, turning off p-channel FET 24. The RESET circuit shown in FIG. 2 generates a RESET pulse width of approximately 700 picoseconds (ps).

Figure 3:
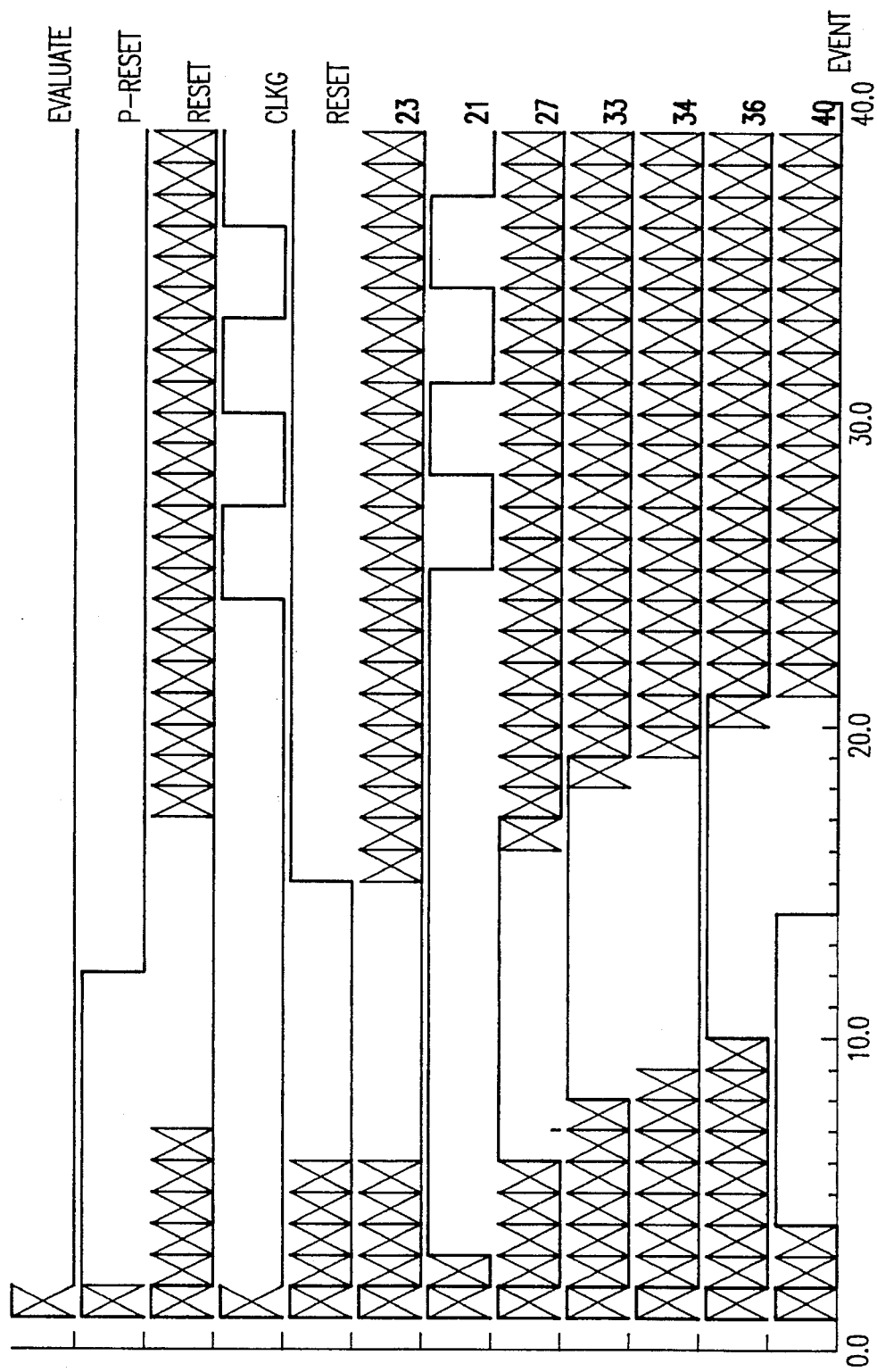
FIG. 3 is timing diagram showing the analysis result from a logic simulator for the RESET circuit of FIG. 2.

If the cycle time of the clock signal CLKG is 2.5 nanoseconds (ns) and if the clock signal CLKG is assumed to have a 50% duty cycle, then the clock signal CLKG will stay low for about 1.25 ns. This creates two problems. First, if the clock signal CLKG stays low for 1.25 ns or more, the output of invertor 21 will be high for the same amount of time. In this situation, p-channel FET 24 tries to pull node 23 high and n-channel FET 22 tries to pull node 23 low in FIG. 2. There will be a d.c. current path from $V_{DD}$ to ground due to the simultaneous conduction of FETs 24 and 22, and node 23 will go to an undetermined state. This will cause the RESET signal to oscillate. This analysis result is shown in FIG. 3. The other problem is that if we try to fix the RESET generation circuit by adding more delays, then the pulse width of the RESET signal becomes very wide. If we use this RESET signal to reset the circuit in FIG. 1, we get into a collision current phenomenon; i.e., input IN0 tries to pull node 13 low, while the RESET signal will try to pull node 13 high through p-channel FET 12. Also, for the long cycle (100 ns cycle time), the circuit will oscillate.

Figure 4:
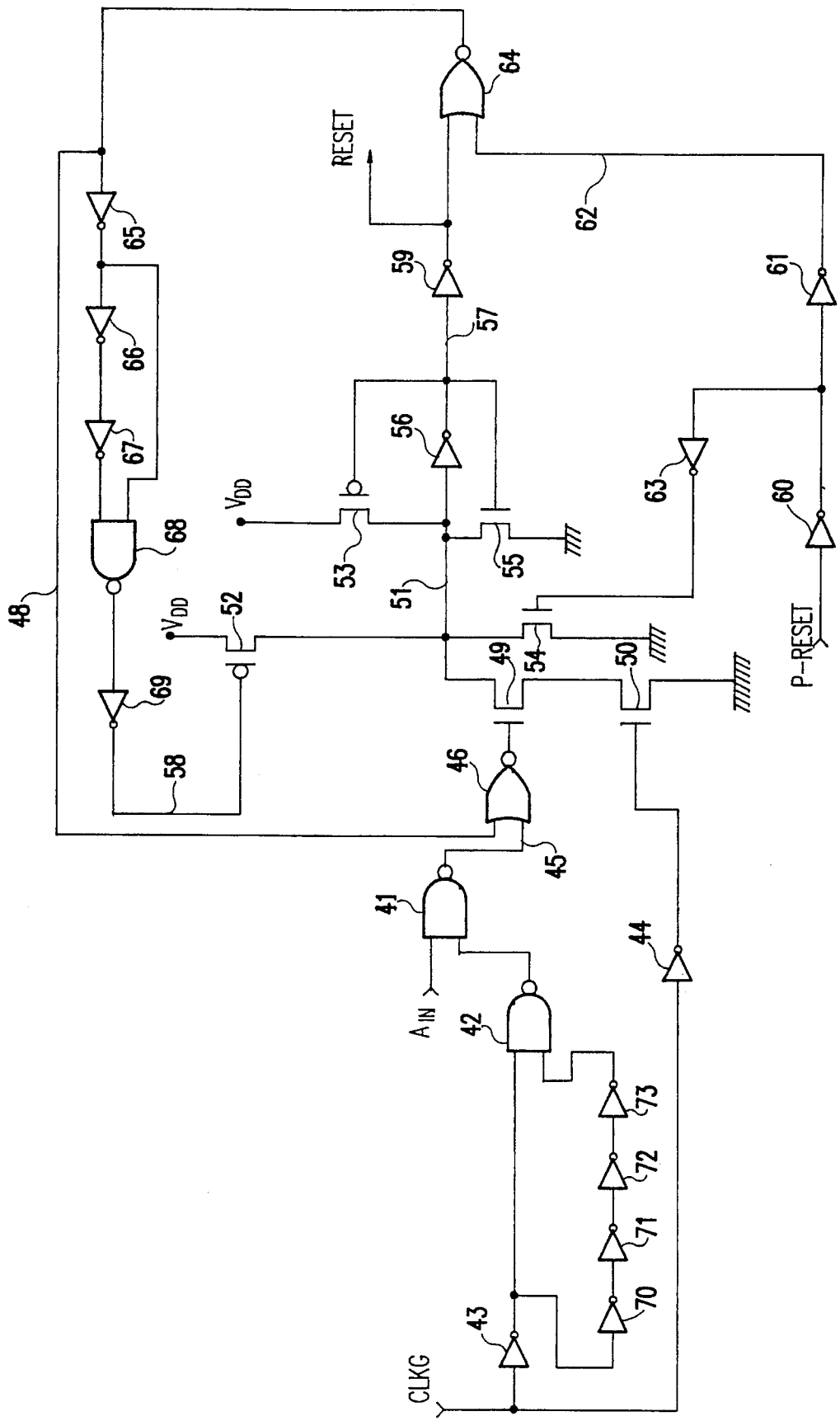
FIG. 4 is a schematic diagram of the RESET circuit of the present invention.
Figure 5:
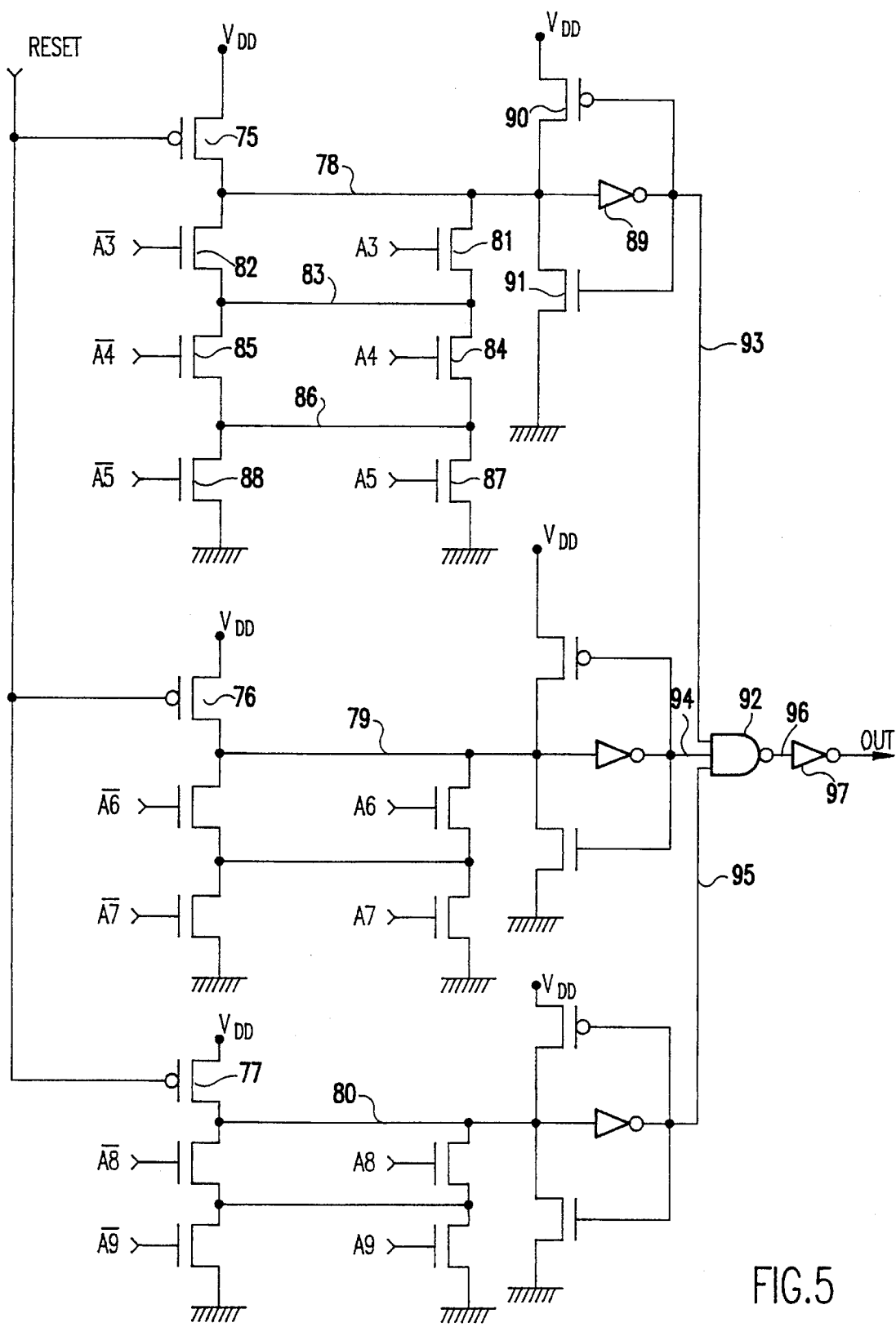
FIG. 5 is a schematic diagram of a portion of an SRCMOS circuit for detecting the arrival of information, such as an address from an array.

The present invention is illustrated by the specific circuit embodiments shown in FIGS. 4 and 5. FIG. 4 is the reset generating circuit, and FIG. 5 is a portion of a SRCMOS circuit used to detect the arrival of an address for an array. With reference first to FIG. 4, there are three inputs AIN, CLKG and P_RESET. The AIN signal is a signal that selected the RESET generation circuit in order to provide a RESET signal to reset the SRCMOS circuits in the following cycle. If no AIN signal is asserted, there will be no RESET generated in the next cycle. The output of this circuit is the RESET signal. The RESET signal resets the SRCMOS circuit shown in FIG. 5. Input AIN is fed to one input of NAND gate 41. The second input of NAND gate 41 is supplied by the output of NAND gate 42. The clock signal CLKG is input to two invertors 43 and 44. The output of the invertor 43 is one of the inputs of NAND gate 42. The output of NAND gate 41 at node 45 is connected to one input of NOR gate 46, the second input of which is connected to node 48. The output of NOR gate 46 is connected to the gate of n-channel FET 49, and the output of invertor 44 is connected to the gate of n-channel FET 50. The FETs 49 and 50 are connected in series between node 51 and ground. Thus, when the outputs of the NOR gate 46 and invertor 44 are both high, the FETs 49 and 50 discharge node 51 to ground. Node 51 is also connected to the drains of p-channel FETs 52 and 53 and to the drains of n-channel FETs 54 and 55. The input of invertor 56 is node 51 and the output is node 57, which is connected to the gates of p-channel FET 53 and n-channel FET 55. The gate of FET 52 is connected to node 58, and the source of FET 52 is connected to $V_{DD}$.

The output of invertor 56 is also connected to invertor 59 which, in turn, is connected to the RESET output terminal. A delay chain of two invertors 60 and 61 is connected between P_RESET and node 62. The output of invertor 61 drives invertor 63 whose output is connected to the gate of n-channel FET 54, and the output of invertor 61, node 62, is one of the inputs of NOR gate 64. The second input of the NOR gate 64 is the RESET signal, and the output NOR gate 64 is node 48. Node 48 is the second input to NOR gate 46 and is also connected to the input of invertor 65, the output of which is connected, via invertor string 66 and 67, to one input of NAND gate 68 and directly to the other input of NAND gate 68. The output of NAND gate 68 is connected to the invertor 69 whose output is connected to the gate of p-channel FET 52. Finally, the second input of NAND gate 42 is supplied by the output of inverter 43 via inverter string 70 to 73 to establish a time delay.

FIG. 5 depicts a circuit to detect the arrival of address bits A3 to A9. The true and complement address bits are both low when no address is present. When an address is present, either the true or the complement address bit will be high. A3 to A9 are the "true" and $\overline{A3}$ to $\overline{A9}$ are the "complement" of the signal. The true addresses from A3 to A9 and complement addresses from $\overline{A3}$ to $\overline{A9}$ are respectively ORed and the results are then ANDed together to generate the output signal at the OUT terminal. The output signal is connected to AIN in FIG. 4. The RESET signal from FIG. 4 is connected to the gates of p-channel FETs 75, 76 and 77. The sources of the FETs 75, 76 and 77 are connected to $V_{DD}$, and their drains are connected to nodes 78, 79 and 80, respectively.

The address bit A3 is connected to the gate of n-channel FET 81, and its complement, address bit $\overline{A3}$, is connected to the gate of n-channel FET 82. Both FETs 81 and 82 have a common drain connection to node 78 and a common source connection to node 83. Similarly, address bit A4 is connected to the gate of n-channel FET 84, and its complement, address bit $\overline{A4}$, is connected to n-channel FET 85. FETs 84 and 85 have a common source connection to node 86 and a common drain connection to node 83. Address bits A5 and $\overline{A5}$ are respectively input to the gates of n-channel FETs 87 and 88, which have a common drain connection to node 86. The sources of FETs 87 and 88 are connected to ground. Node 78 is also connected to the input of invertor 89 and to the drains of p-channel FET 90 and n-channel FET 91. The source of FET 90 is connected to $V_{DD}$, and the source of FET 91 is connected to ground. The output of invertor 89 is connected to the gates of FETs 90 and 91 and also to one input of NAND gate 92.

The same circuit explanation applies to the rest of the circuit of FIG. 5, and so a detailed description is omitted. The three inputs of NAND 92 are nodes 93, 94 and 95, and its output is node 96 which is connected to the input of invertor 97. The output of invertor 97 is the output terminal OUT which is connected to input terminal AIN in FIG. 4.

Initially, the P_RESET signal in FIG. 4 is high which forces the output of invertors 63 and 61 to be high. This action forces node 51 and the RESET signal to be low. If the RESET signal is low, all SRCMOS circuits in FIG. 5 are reset; i.e., all the SRCMOS circuits are precharged to $V_{DD}$. For example, nodes 78, 79 and 90 are precharged to $V_{DD}$ in FIG. 5, and the output signal at the OUT terminal is forced low. Also, node 62 is high which forces node 58 to go high, keeping p-channel FET 52 off. Once the P_RESET signal goes low, this will allow the circuit in FIG. 4 to reset itself; i.e., node 51 is precharged to $V_{DD}$.

Input AIN is generated by combining all the row addresses A3 to A9 as shown in FIG. 5. The cycle begins with the clock signal CLKG going from high to low. When the clock signal CLKG goes low, approximately 1.5 ns later, all the input addresses will go high; i.e., either true or complement addresses A3 to A9 will switch high in one cycle. The high going address inputs A3 to A9 will pull nodes 78, 79 and 80 to ground. Consequently, nodes 93, 94 and 95 are pulled high. The output of NAND gate 92 is forced low and the output of invertor 97 is forced high.

The first key feature of this circuit is that the latest address sets this circuit; i.e., the output signal on the OUT terminal is forced high. This means that if the addresses are coming from a long distance, the circuit will wait for the last address to come before switching. This eliminates any false RESET generation.

The second key feature is that once the AIN input signal makes a positive transition, it will not reset until the RESET signal goes low. This will cause the AIN input signal to remain high regardless of the cycle time.

The clock signal CLKG going negative starts the cycle. There are three paths for the clock signal CLKG. The first path causes the output of invertor 44 in FIG. 4 to go low, interrupting ground and preventing the positive going output of NOR gate 46 from pulling node 51 low until the next cycle. The second path causes the high going output of NAND gate 42 to be able to pass through the NAND gate 41 if input signal AIN is high. Since there are four gate delays in the second path to the output of NOR gate 46 when the clock signal CLKG goes high versus only one gate delay for the first path, the output of invertor 44 will always turn off before the output of NOR gate 46 goes high. The third path is a longer path than the second path and has eight stages, including the invertor chain 70 to 73. This path is designed so that it takes a long time for the falling edge of clock signal CLKG to cause the output of NOR gate 46 to go low, while the first path is very fast with only one stage. This will guarantee that outputs of NOR gate 46 and invertor 44 will both be high at the beginning of the cycle if the input signal AIN is pulsed high in the previous cycle, and thus starting a reset in cycle 2.

The clock signal CLKG works in two modes; a regular mode and a long cycle mode. In the regular mode, the cycle time of the clock signal CLKG is 2.7 ns. If it is assumed that the clock signal CLKG has a duty cycle of 50%, then the clock signal CLKG will stay either low or high for 1.35 ns. There is a 400 ps delay in generating the output signal on the OUT terminal in FIG. 5 once all the addresses switch high, which means that the input signal AIN will go high in approximately 1.9 ns, assuming that once the clock signal CLKG goes low it takes 1.5 ns for all the addresses to go high, and by that time the clock signal CLKG is switched to high. In the beginning, when the clock signal CLKG is low, the output of NOR gate 46 is also low, hence node 51 is high. When the clock signal CLKG goes high, input signal AIN is forced high after 550 ps. By that time, the output of the invertor 44 is low. Hence, there is no discharge of node 51 to ground.

When the clock signal CLKG goes low, the output of invertor 44 is forced high. At that time, the output of NOR gate 46 is also high. This forces node 51 to discharge to ground. This low pulse of clock signal CLKG has to travel the eight gate delays to pull the output of NOR gate 46 low. By that time, node 51 is discharged fully to ground and the RESET signal goes low. The input which will be arriving first at the NOR gate 46 (either node 45 or node 48) will turn off NOR gate 46, causing its output to go low. After a certain time delay, the output of invertor 69 changes its state from high to low, and node 51 is precharged to $V_{DD}$. Either node 48 or node 45 works as a ground interrupt device for the output of NOR gate 46 and eliminates the collision current on node 51.

Figure 6:
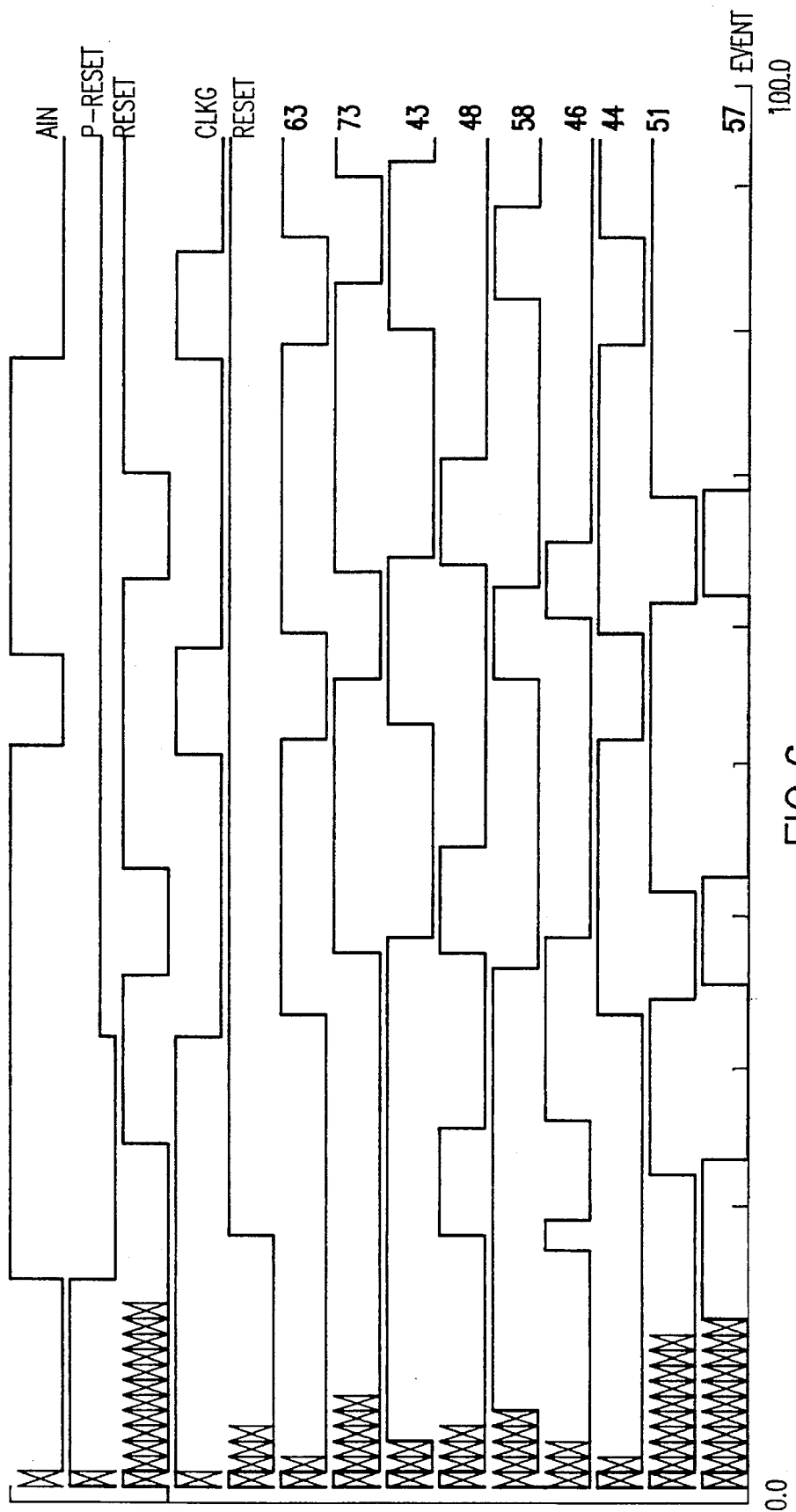
FIG. 6 is a timing diagram showing the result of the logic simulator for the RESET Circuit of FIG. 4.
Figure 7:
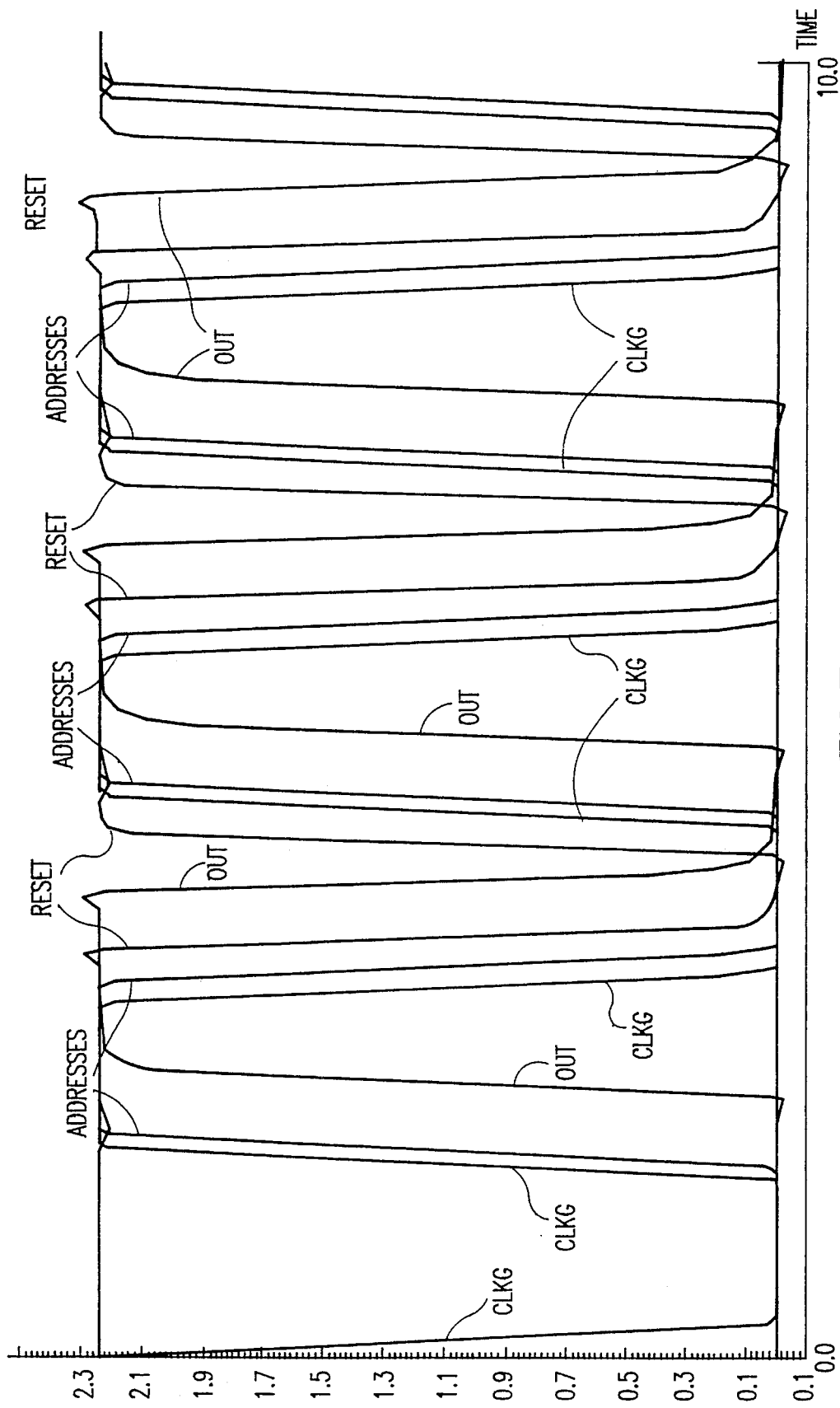
FIG. 7 is a graph of the spike simulation result of the RESET circuit according to the invention.

When node 51 is precharged to $V_{DD}$, the RESET signal goes high and node 48 goes low. In this case, the output of invertor 69 remains low until the output of invertor 67 goes high. Then the output of invertor 69 goes high and turns off p-channel FET 52. By this time, the low going edge of the RESET signal resets the circuit in FIG. 5, and the input signal AIN is forced low. This is the way we generate the fast RESET pulse and the output of invertor 69 precharges node 51 for a longer time. The logic simulator results are shown in FIG. 6, in which the waveforms for all nodes of the RESET circuit are plotted. It is obvious, from the waveform analysis results, that there is no undetermined state or oscillation. FIG. 7 shows the spike simulation results.

In the long cycle mode, the clock signal CLKG either stays low or high for a long time. When the clock signal CLKG goes low, after a certain time delay, all the addresses go high (approximately 1.5 ns later). This forces the output signal on the OUT terminal in FIG. 5 to go high. The output of NAND gate 42 in FIG. 4 is already low, and node 45 is high. This keeps the output of NOR gate node 46 low. Although the output of invertor 44 is high, the output of NOR gate 46 is low and keeps node 51 precharged to $V_{DD}$.

When the clock signal CLKG goes high, the output of NAND gate 42 is forced high and node 45 goes low. This forces the output of NOR gate node 46 to go high, but before this happens, the output of invertor 44 goes low as soon as the clock signal CLKG goes high. Node 51 therefore does not discharge to ground. When the clock signal CLKG goes low, the output of invertor 44 is forced high and discharges node 51 to ground. This generates the RESET pulse. After a certain time delay, the output of NAND gate 42 goes low and node 45 goes high. Node 45 forces the output of NOR gate 46 to go low. Also, node 48 goes high, turning off n-channel FET 49 before node 58 goes low and turns on p-channel FET 52.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A RESET circuit for a self resetting CMOS (SRCMOS) circuit comprising:

a charging means connected between a source of voltage and a node in the RESET circuit for charging said node to a predetermined voltage in response to a RESET signal;

a discharge means connected between said node and ground, said discharge means including ground interrupt means for preventing a discharge of said node;

a latch connected to said node for generating said RESET signal in response to a discharge of said node; and a clock input circuit having multiple paths, a first path being connected to said ground interrupt means and a second path being connected to said discharge means, said ground interrupt means further enabling a discharge of said node in response to said RESET signal, said first path comprising a greater time delay than said second path so that said ground interrupt means prevents discharging of said node while said charging means charges said node.

2. The RESET circuit for an SRCMOS circuit as recited in claim 1 wherein said discharge means includes a first field effect transistor (FET) and a second FET connected in series between said node and ground, said first FET being controlled by the ground interrupt means and the second path controlling conduction or non-conduction of said second FET.

3. The RESET circuit for an SRCMOS circuit as recited in claim 2 further comprising a gate providing an OR function, said first gate having a first input connected to receive said RESET signal and a second input connected to said first path.

4. The RESET circuit for an SRCMOS circuit as recited in claim 3 wherein said second path includes a second gate providing an AND function, said second gate having a first input connected to receive a signal for enabling a reset generation in a following cycle and a second input for receiving a clock signal.

5. The RESET circuit for an SRCMOS circuit as recited in claim 4 wherein said second path further includes a third gate providing an AND function, an output of said third gate being connected to the second input of said second gate, said third gate having a first input connected to receive said clock signal and a second input connected to receive a delayed clock signal, said second input of said third gate constituting a third path of said clock input circuit.

6. The RESET circuit for an SRCMOS circuit as recited in claim 5 wherein said charging path comprises an FET connected between a source of charging voltage and said node, said reset circuit further comprising delay means connected between an output of said latch and said third FET to control charging of said node.

7. The RESET circuit for an SRCMOS circuit as recited in claim 6 wherein said first and second FETs are n-channel FETs and said third FET is a p-channel FET, said first gate is a NOR gate, and said second and third gates are NAND gates.

8. The RESET circuit for an SRCMOS circuit as recited in claim 7 wherein said latch comprises an n-channel FET connected between said node and ground, a p-channel FET connected between said source of charging voltage and said node, and an inverter having an input connected to said node and an output connected to gates of said third n-channel FET and said second p-channel FET.

9. The RESET circuit for an SRCMOS circuit as recited in claim 5 further comprising a second discharge means connected to said node and a fourth gate providing an OR function, a first input of said fourth gate being said RESET signal from said latch and a second input of said fourth gate being a system reset signal, said system reset signal additionally controlling said second discharge means so that when said system reset signal is present, said node is initially discharged followed by charging said node to reset said RESET circuit.

10. The RESET circuit for an SRCMOS circuit as recited in claim 9 wherein said charging path comprises an FET connected between a source of charging voltage and said node, said RESET circuit further comprising delay means connected between an output of said fourth gate and said third FET to control charging of said node.

11. The RESET circuit for an SRCMOS circuit as recited in claim 10 wherein said first and second FETs are n-channel FETs and said third FET is a p-channel FET, said first and fourth gates are NOR gates, and said second and third gates are NAND gates.

12. The RESET circuit for an SRCMOS circuit as recited in claim 11 wherein said latch comprises an n-channel FET connected between said node and ground, a p-channel FET connected between said source of charging voltage and said node, and an inverter having an input connected to said node and an output connected to gates of said third n-channel FET and said second p-channel FET.

* * * * *